United States Patent [19]

Sugayama

[11] Patent Number: 4,955,077
[45] Date of Patent: Sep. 4, 1990

[54] RADIO WITH BROAD BAND AUTOMATIC GAIN CONTROL CIRCUIT

[75] Inventor: Sakae Sugayama, Ohra, Japan
[73] Assignee: Sanyo Electric Co., Ltd., Osaka, Japan
[21] Appl. No.: 269,904
[22] Filed: Nov. 10, 1988

[30] Foreign Application Priority Data

Nov. 16, 1987 [JP] Japan ................... 62-288821

[51] Int. Cl.$^5$ .................... H04B 1/26; H04B 1/10
[52] U.S. Cl. .................... 455/197; 455/234; 455/247; 455/296; 455/236
[58] Field of Search ........... 455/295, 296, 254, 250, 455/246, 247, 239, 240, 234, 311, 200, 182, 183, 264, 249, 308, 164, 165, 260, 197

[56] References Cited

U.S. PATENT DOCUMENTS 4,355,414 10/1982 Inoue ....................... 455/249

FOREIGN PATENT DOCUMENTS 0049030 4/1980 Japan ....................... 455/165

OTHER PUBLICATIONS

Handbook entitled "Sanyo's 1985 Semiconductor Monolithic Bipolar Integrated Circuit" pub. Mar. 20, 1985, pp. 81–90.

Primary Examiner—Reinhard J. Eisenzopf
Assistant Examiner—Curtis Kuntz
Attorney, Agent, or Firm—Darby & Darby

[57] ABSTRACT

The disclosure relates to a radio which prevents the level of a signal transmitted from a desired broadcasting station from being suppressed by the operation of a broad band automatic gain control circuit in the presence of an interference signal. The radio comprises a first detector for detecting the intensity of the electric field of a received signal; a second detector for detecting whether or not the broad band automatic gain control is operating; and a device for changing the tuning condition of a radio frequency tuning circuit in a small extend in response to the signals outputted from the first and second detectors.

6 Claims, 3 Drawing Sheets

RADIO WITH BROAD BAND AUTOMATIC GAIN CONTROL CIRCUIT

BACKGROUND OF THE INVENTION

1. Field of the Invention

The present invention relates to a radio provided with a broad band automatic gain control circuit, and more particularly, to a radio which prevents the level of a signal transmitted from a desired broadcasting station from being suppressed by the operation of the broad band automatic gain control circuit in the presence of an interference signal.

2. Description of Related Art

A handbook entitled "SANYO'S 1985 Semiconductor Monolithic Bipolar Integrated Circuit" published on Mar. 20, 1985 describes on page 81 through 90 an IC (LA 1135) for use in an amplitude modulation (AM) tuner provided with a broad band automatic gain control (AGC) circuit. As shown in FIG. 2, as well known, the PLL 10 and the control circuit 16 are provided in microcomputers for use in synthesizers.

A radio wave received by the radio shown in FIG. 2 is converted into a sound signal, at the output terminal of the detecting circuit 9, corresponding to the radio wave signal transmitted from a desired broadcasting station. However, if an interference signal with a high level transmitted from a different broadcasting station is received in addition to the signal of the desired broadcasting station, the broad band AGC operates. As a result, the level of the signal transmitted from the desired broadcasting station is suppressed. If the intensity of the electric field of the signal transmitted from the desired broadcasting station is weak, the level of the signal transmitted from the desired broadcasting station becomes very low because the signal level is suppressed. Consequently, it is difficult to listen to the broadcasting of the desired broadcasting station.

SUMMARY OF THE INVENTION

The present invention has been made with a view to substantially solving the above-described disadvantage and has for its object to provide an improved radio comprising a first detecting means for detecting the intensity of the electric field of a signal received by the radio; a second detecting means for detecting whether or not a broad band automatic gain control (AGC) is operating; and a means for changing the tuning condition of an RF tuning circuit in a small extent in response to the signals outputted from the first and second detecting means.

According to the present invention, when only the signal transmitted from a desired broadcasting station is received with the intensity of the electric field thereof large, a signal is not generated by the first detecting means. Therefore, the tuning condition of the RF tuning circuit does not change. When only the signal transmitted from the desired broadcasting station is received with the intensity of the electric field thereof small, a signal is not generated by the second detecting means because the broad band AGC circuit does not operate. Accordingly, the tuning condition of the RF tuning circuit does not change. Further, when an interference signal of a high level which causes the broad band AFC to operate is received from an undesired broadcasting station in addition to the signal of the desired broadcasting station, signals are outputted from both the first and second detecting means, whereby the tuning condition of the RF tuning circuit changes in a small extent. Accordingly, even though the broad band AGC operates in response to the interference signal transmitted from the undesired broadcasting station, the level of the signal transmitted from the desired broadcasting station is not suppressed.

According to the present invention, when the level of the signal transmitted from the desired broadcasting station is low while the level of the signal transmitted from the undesired broadcasting station is high, the signal level of the desired broadcasting station is not suppressed by the broad band AFC because the tuning condition of the RF tuning circuit is changed in a small extent. Therefore, the signal transmitted from the desired broadcasting station is received in a high sensitivity. In particular, the appropriate change of the tuning state of the RF tuning circuit using a microcomputer allows the radio to receive the signal transmitted from the desired broadcasting station in an optimum condition, or an optimum sensitivity. According to the present invention, the RF tuning circuit is controlled while the local oscillation circuit is not controlled. Therefore, there is no drawback such as the change of an IF frequency in receiving the signal transmitted from the desired broadcasting station.

BRIEF DESCRIPTION OF THE DRAWINGS

The object and features of the present invention will become apparent from the following description taken in conjunction with preferred embodiment thereof with reference to the accompanying drawings, throughout which like parts are designated by like reference numerals, and in which.

DETAILED DESCRIPTION OF THE INVENTION

Figure 1:
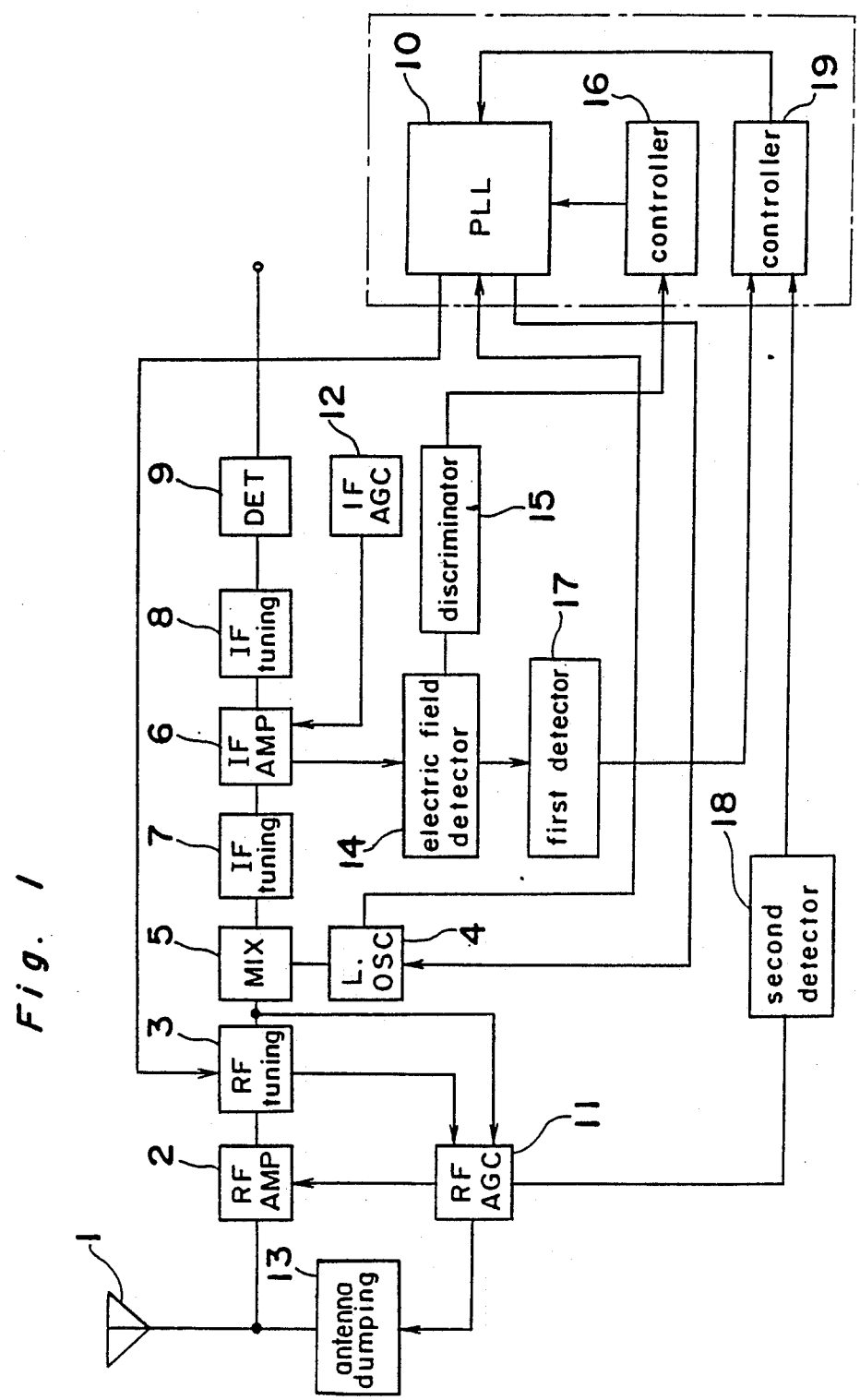
FIG. 1 is a circuit diagram showing one embodiment of the present invention.
Figure 2:
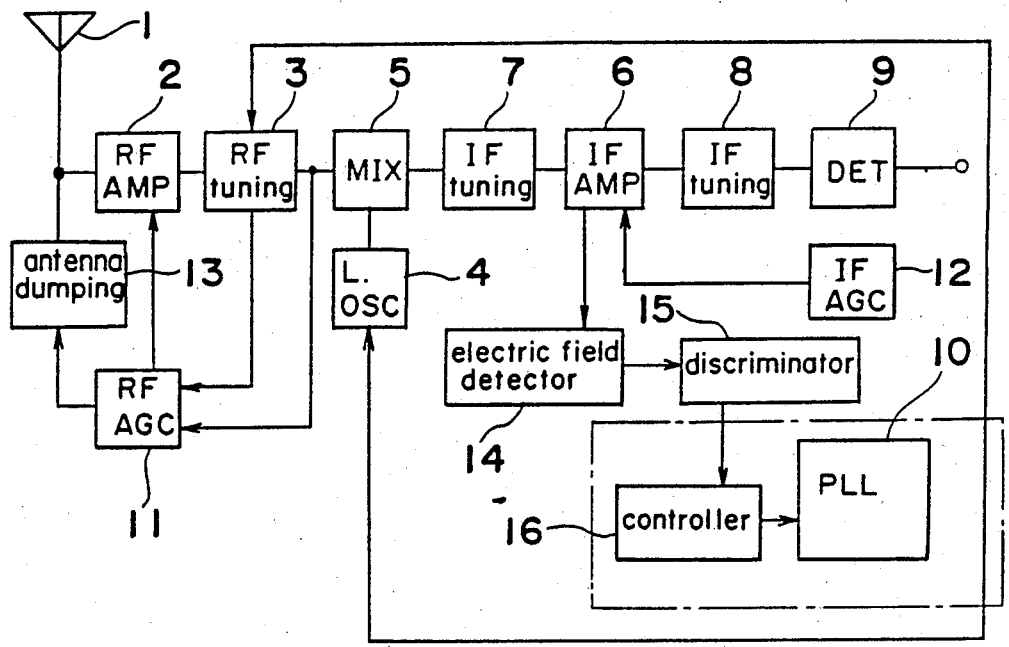
FIG. 2 is a circuit diagram showing a known radio.

Referring to FIG. 1, a radio using the above-described IC comprises a radio frequency (RF) amplifier circuit 2 for amplifying a signal received by an antenna 1, an RF tuning circuit 3 for tuning an RF signal outputted from the RF amplifying circuit 2, a mixing circuit 5 which mixes the RF signal with an oscillation signal outputted from a local oscillation circuit 4 to generate an inter-ference frequency (IF) signal, an IF amplifying circuit 6 for amplifying the IF signal, IF tuning circuits 7 and 8 for tuning the IF signal, a detecting circuit 9 for detecting the IF signal, a phase-locked loop (PLL) 10 for applying a tuning voltage to a varactor diode provided in the RF tuning circuit 3 and the local oscillation circuit 4, a radio frequency automatic gain control (RF-AGC) circuit 11 for effecting a broad band AGC and an inter-ference frequency automatic gain control (IF-AGC) circuit 12 for performing an AGC operation in accordance with the level of a signal outputted from the detecting circuit 9, the RF-AGC circuit 11 detecting both the level of RF signals whose bands have been limited and have not been limited by the RF tuning circuit 2, and an antenna dumping circuit 13 for performing a broad band AGC, a stop signal being generated while an automatic search operation is being performed through an electric field intensity-detecting circuit 14, a distinction circuit 15, and a control circuit 16. The above construction of the embodiment of the present invention is the same to the circuits of FIG. 2. The circuits of FIG. 1 further comprises a first detecting circuit 17 for detecting whether or not the intensity of the electric field of a received signal is more than a predetermined level, a second detecting circuit 18 for detecting whether or not an RF-AGC circuit 11 is operating, and a control circuit 19 for generating a control signal for changing the tuning condition created by a PLL 10 in a small extent when signals are simultaneously outputted from the first detecting circuit 17 and the second detecting circuit 18.

An automatic search of a signal starts when a search switch (not shown) is closed to operate a PLL 10. As a result, the tuning frequency of an RF tuning circuit 3 and the oscillation frequency of a local oscillation circuit 4 change. If a signal whose electric field intensity is sufficient is received by the automatic search operation, a high level signal is outputted from an electric field intensity-detecting circuit 14. As a result, an "H" level signal is outputted from a distinction circuit 15. The signal outputted from the distinction circuit 15 is applied to a first control circuit 16. The first control circuit 16 applies a search stop signal to the PLL 10 to stop the automatic search operation. The radio keeps receiving signals from the broadcasting station with the detecting circuit 9 outputting sound signals corresponding to the radio wave signals transmitted from the broadcasting station.

When only a signal of a desired broadcasting station above a predetermined level is received in a tuning condition the RFAGC circuit 11 performs an AGC operation, that is, the RF-AGC circuit reduces the gain of an RF amplifying circuit 2 and operates a dumping circuit 13. The operation of the RF-AGC circuit 11 causes the second detecting circuit 18 to output a signal which is to be applied to the second control circuit 19. Since the level of the signal of the desired broadcasting station is high, an "H" level signal is outputted from the electric field intensity-detecting circuit 14. When the "H" level signal is applied from the electric field intensity-detecting circuit 14 to the first detecting circuit 17, no signals are outputted from the first detecting circuit 17. This is because the first detecting circuit 17 generates an "H" level signal in response to an "L" level signal not in response to an "H" level signal. Consequently, no control signals are outputted from the second control circuit 19. Thus, the radio maintains the tuning condition.

When only a signal of the desired broadcasting station below a predetermined station in a tuning condition, a broad band AGC operation does not operate. Therefore, no "H" signals are outputted from the second detecting circuit 18, and as such, no controls signals are outputted from the second control circuit 19.

When an interference signal having a high level transmitted from an undesired broadcasting station is received in addition to a signal transmitted from the desired broadcasting in a tuning condition, the RF-AGC circuit 11 operates in response to the interference signal having the high level, with the result that a broad band AGC is performed. As a result, the level of the interference signal is reduced to the AGC level. At that time, the level of the signal transmitted from the desired broadcasting station is reduced at the same rate as the rate at which the interference signal is suppressed. If the level of the signal transmitted from the desired broadcasting station is sufficiently high, there is no problem even if it is suppressed by the broad band AGC. To the contrary, if the level of the signal transmitted from the desired broadcasting station is low, its level becomes lower because it is suppressed by the broad band AGC. Such a condition makes it unbearable to listen to the radio.

According to the present invention, an interference signal, namely, a signal transmitted from an undesired broadcasting station is removed by the IF tuning circuit 7, the level of the IF signal is detected by the electric field intensity-detecting circuit 14, and the level of the IF signal is discriminated by the first detecting circuit 17. Therefore, if the level of the IF signal becomes less than the predetermined value, an "H" level signal is outputted from the first detecting circuit 17. When "H" level signals are outputted from the first detecting circuit 17 and the second detecting circuit 18, a control signal is outputted from the second control circuit 19. The control signal is applied to the PLL 10. Upon receipt of the control signal, the PLL 10 changes the tuning frequency of the RF tuning circuit 3 in a small extent. As a result, the band of the RF tuning circuit 3 shifts and the signal transmitted from the undesired broadcasting station is received at a level lower than the operation level of the broad band AGC, i.e., the broad band AGC operation is not performed. Consequently, the signal transmitted from the desired broadcasting station whose level has been suppressed by the broad band AGC is not suppressed.

Figure 3:
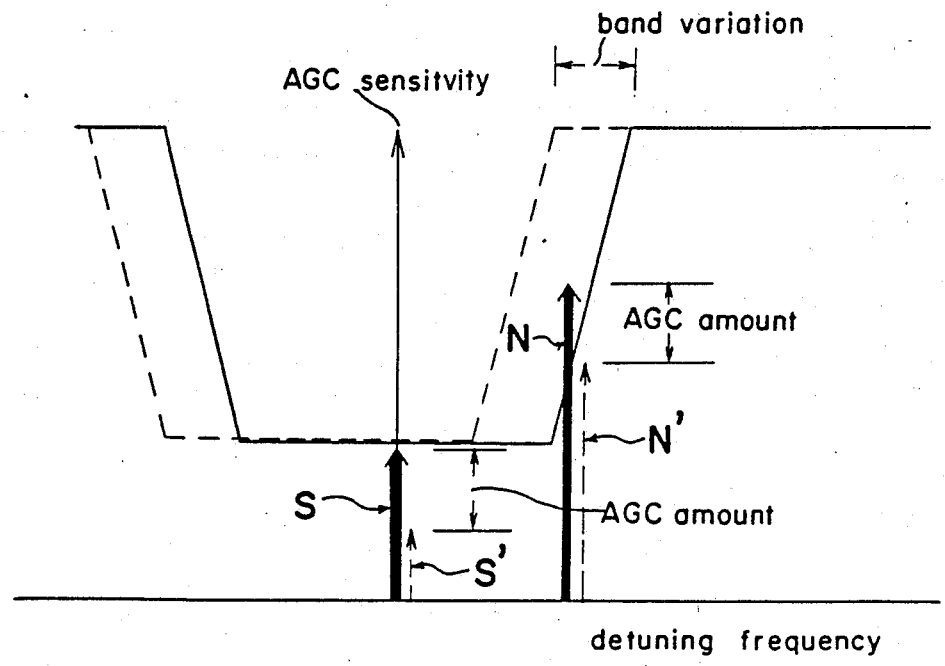
FIG. 3 is a characteristic view for describing the present invention.

FIG. 3 is a characteristic view showing the shift of the band of the RF tuning circuit 3. FIG. 3 indicates that when the level of the signal transmitted from the undesired broadcasting station is higher than that transmitted from the desired broadcasting station, the band of the RF tuning circuit 3 shifts from the state shown by the solid line to the state shown by the broken line. Before a broad band AGC is effected, the signal transmitted from the desired broadcasting station has the level as shown by the solid line (s). However, the level of the signal shown by solid line (N) of the undesired broadcasting station is suppressed to the level as shown by the broken line (N') by the broad band AGC and the level of the signal shown by (S) transmitted from the desired broadcasting station is also suppressed. Both signals are suppressed in the same amount, i.e., the level of the signal transmitted from the desired station is suppressed to the level as shown by the broken line (S'). When the band is shifted from the state shown by the solid line to state shown by the broken line in this condition, the level of the signal (N) transmitted from the undesired broadcasting station does not reach the AGC level, that is, an AGC operation cannot be performed. As a result, the levels of the signals ((N) and (S)) transmitted from the undesired and desired broadcasting stations return to the state shown by the solid lines. Since a signal having a very high level transmitted from the undesired broadcasting station is removed by the narrow band-IF tuning circuit 7, no interference occurs in receiving a signal from the desired broadcasting station.

Figure 4:
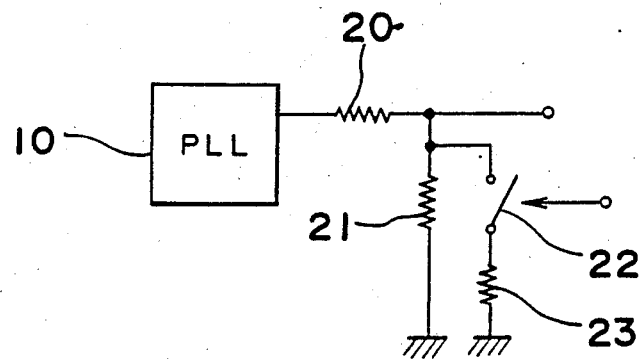
FIG. 4 is a circuit diagram showing a specific example of a circuit of the present invention.

The tuning frequency of the RF tuning circuit 3 can be changed or the band thereof can be shifted by changing the control voltage which is to be applied from the PLL 10 to the varactor diode (not shown) provided in the RF tuning circuit 3. The control voltage can be changed as follows: As shown in FIG. 4, a first voltage-dividing resistor 20 and a second voltage-dividing resistor 21 are connected to the output terminal of the PLL 10 and a series circuit comprising a switch 22 and a third resistor 23 is connected to the second voltage-dividing resistor 21 in parallel with each other. The switch 22 is closed or opened in response to the control signal supplied thereto from the second control circuit 19. The control voltage may also be changed by changing the lower-order bits of the frequency-dividing data to be set in the programmable counter (not shown) of the PLL 10 according to the level of the control signal.

Further, the tuning frequency of the RF tuning circuit 3 can be changed as follows: When a control signal is generated by the second control circuit 19, the level of the signal outputted from the electric field intensity-detecting circuit 14 is monitored to change the frequency dividing data to be set in the programmable counter of the PLL 10 so that the level of the signal outputted from the electric field intensity-detecting circuit 14 is maximum. In this operation, the shift amount of the band of the RF tuning circuit 3 which maximizes the level of the signal outputted from the electric field intensity-detecting circuit 14 can be easily set by a microcomputer.

Although the present invention has been fully described by way of examples with reference to the accompanying drawings, it is to be noted here that various changes and modifications will be apparent to those skilled in the art. Therefore, unless otherwise such changes and modification depart from the scope of the present invention, they should be construed as being included therein.

What is claimed is:

1. A radio which includes a radio frequency (RF) amplifier circuit for amplifying received signals and an RF tuning circuit connected with the RF amplifier circuit, comprising:
   a broad band automatic gain control circuit for controlling gain of the RF amplifier circuit in response to RF signals which are to be obtained by the RF tuning circuit;
   a first detecting means for detecting the intensity of the electric field of the received signals;
   a second detecting means for detecting whether or not said band automatic gain control circuit is operating;
   means for generating a control signal when signals are simultaneously outputted from the first detecting means and the second detecting means; and
   means for changing a tuning frequency of the RF tuning circuit in response to the control signal.

2. The radio as defined in claim 1, further comprising a mixing circuit for generating interference frequency (IF) signals, said mixing circuit being connected to the RF tuning circuit and an IF amplifying circuit for amplifying the IF signals, the first detecting means being adapted for detecting a level of the amplified IF signals obtained from the IF amplifying means.

3. The radio as defined in claim 2, wherein the first detecting means generates an output in the event of the level of the IF signals being lower than a predetermined value, the second detecting means generating an output whent the broad band automatic gain control circuit is operated.

4. The radio as defined in claim 1, wherein the RF tuning circuit has a varactor diode, further comprising means for changing a tuning frequency of the RF tuning circuit by changing a control voltage which is to be applied from a phase-locked loop (PLL) to the varactor diode.

5. A radio comprising:
   a radio frequency (RF) amplifier circuit for amplifying a signal received by an antenna;
   an RF tuning circuit for tuning an RF signal outputted from the RF amplifier circuit;
   a mixing circuit which mixes the RF signal with an oscillation signal outputted from a local oscillation circuit to generate an interference frequency (IF) signal;
   an IF amplifier circuit for amplifying the IF signal;
   an IF tuning circuit for tuning the IF signal;
   an IF signal detecting circuit for detecting the IF signal;
   a phase-locked loop (PLL) for applying a tuning voltage to a varactor diode provided in the RF tuning circuit and the local oscillation circuit;
   a radio frequency automatic gain control (AF AGC) circuit for controlling gain of the RF amplifier circuit in response to the RF signal obtained from the RF tuning circuit;
   an interference frequency automatic gain control (IF AGC) circuit for controlling gain of the IF amplifier circuit in response to the output signal of the IF signal detecting circuit;
   an antenna dumping circuit for dumping the signal received into the antenna in response to the output signal of the RF AGC circuit;
   a stop signal generating means for generating a stop signal upon detecting a level of the IF signal obtained from the IF amplifier circuit;
   a first detecting circuit for detecting whether or not an intensity of the electric field of the received signal is more than a predetermined level;
   a second detecting circuit for detecting whether or not the RF AGC circuit is operating; and
   a control circuit for generating a control signal for changing the tuning condition created by the PLL when signals are simultaneously outputted from the first detecting circuit and the second detecting circuit.

6. A radio comprising:
   amplifying means for amplifying received radio frequency (RF) signals including interference signals (RF);
   tuning means for tuning the RF signals to produce tuned RF signals;
   gain control means for controlling gain of said amplifier means in response to the tuned RF signals obtained from said tuning means, said gain control means operating by reducing a gain of said amplifying means in response to the tuned RF signals being above a predetermined level;
   first detecting means for detecting when a level of intensity of an electric field of the IF signals is below a predetermined level;
   second detecting means for detecting whether or not said gain control means is operating; and
   shifting means responsive to simultaneous conditions of both said first detecting means detecting that the level of the IF signals is below said predetermined level and said second detecting means detecting operation of said gain control means for shifting a band of said tuning means so that said tuned RF signals are no longer above said predetermined level, said gain control means being responsive to said shifting of said band such that said gain control means ceases operation after the tuned RF signals are shifted so as to be no longer above said predetermined level.

* * * * *